US006980163B2

(12) United States Patent
Terreault et al.

(10) Patent No.: US 6,980,163 B2
(45) Date of Patent: Dec. 27, 2005

(54) SIGNAL LEAKAGE DETECTOR

(75) Inventors: Gérard Terreault, Pierrefonds (CA); Jean Lewis, Montréal-Nord (CA); Raffaele Gerbasi, Blainville (CA)

(73) Assignee: Sunrise Telecom Incorporated, San Jose, CA (US)

( * ) Notice: Subject to any disclaimer, the term of this patent is extended or adjusted under 35 U.S.C. 154(b) by 0 days.

(21) Appl. No.: 10/791,888

(22) Filed: Mar. 4, 2004

(65) Prior Publication Data

US 2004/0174309 A1 Sep. 9, 2004

Related U.S. Application Data

(60) Provisional application No. 60/451,653, filed on Mar. 5, 2003.

(51) Int. Cl.[7] .................... G01R 29/10
(52) U.S. Cl. .................... 343/703; 324/95; 348/180
(58) Field of Search .................... 343/703, 901, 343/702, 192; 324/95, 77, 637; 348/6, 180, 348/192

(56) References Cited

U.S. PATENT DOCUMENTS

| | | | | |
|---|---|---|---|---|
| 3,634,760 A * | 1/1972 | Murtin et al. | ............ | 324/76.23 |
| 3,946,388 A * | 3/1976 | Schifrine | ............ | 342/445 |
| 5,117,377 A * | 5/1992 | Finman | ............ | 703/2 |
| 5,398,276 A * | 3/1995 | Lemke et al. | ............ | 379/21 |
| 5,493,210 A | 2/1996 | Orndorff et al. | ............ | 324/95 |
| 5,608,428 A | 3/1997 | Bush | ............ | 348/6 |
| 5,982,165 A | 11/1999 | Bowyer et al. | ............ | 324/95 |
| 6,018,358 A | 1/2000 | Bush | ............ | 348/6 |
| 6,118,975 A | 9/2000 | Bowyer et al. | ............ | 455/3.1 |
| 6,307,593 B1 | 10/2001 | Bowyer et al. | ............ | 348/461 |
| 6,313,874 B1 | 11/2001 | Bowyer et al. | ............ | 348/180 |
| 6,472,947 B1 * | 10/2002 | Zeitz | ............ | 333/17.1 |
| 6,541,984 B2 * | 4/2003 | Kobuchi et al. | ............ | 324/637 |
| 6,611,150 B1 * | 8/2003 | Stevens | ............ | 324/613 |

* cited by examiner

*Primary Examiner*—Hoang V. Nguyen

(57) ABSTRACT

An antenna apparatus for detecting a leaked electromagnetic signal is provided. The apparatus includes a telescoping antenna and a casing, which has a portion of the antenna mounted in it. The antenna can move telescopically relative to the casing between an extended configuration, in which the antenna extends away from the casing, and a retracted configuration, in which the antenna is housed in the casing. A signal analyzer is located in the casing and is connected to the telescoping antenna. The antenna detects the electromagnetic signal, which is analyzed by the signal analyzer.

20 Claims, 2 Drawing Sheets

SIGNAL LEAKAGE DETECTOR

CROSS-REFERENCE TO RELATED APPLICATION

Benefit of U.S. Provisional patent application, ser. No. 60/451,653, filed Mar. $5^{th}$, 2003, is hereby claimed.

FIELD OF THE INVENTION

The present invention concerns telecommunications networks and more particularly to detectors for detecting signal leakage in the networks.

BACKGROUND OF THE INVENTION

Cable systems use coaxial cable and multiple connectors and housings to distribute television and data service signals across large areas. Electromagnetic shielding is important to prevent the signal from leaking and disrupting over-the-air legitimate signal (specially aeronautical transmission). Consequently, signal leakage detection assessment, generally compiled into a Cumulative Leakage Index (CLI), is required to meet FCC (Federal Communication Commission) regulations of the United States, or the like commission, as well as for preventive maintenance.

The leakage detection can be done in different ways, using a specially designed receiver with either a dipole antenna at half wavelength (as per regulation) or a short monopole antenna. The latter, commonly called a "rubber ducky", is rugged but not matched to the receiver, less sensitive and has no directivity. Leakage detection is usually performed using specific installations, and also can be performed by so-called patrols across large areas, either on ground or on an aircraft.

Cable signals, especially when other signals could be found to be of close frequencies, are usually "tagged" with either amplitude (AM) or frequency (FM) modulation for identification purpose, helpful during leakage detection assessment.

Presently, there are two (2) types of measure instruments for leakage detection: a self-contained leakage detector or a leakage detector combined with a SLM (Signal Level Meter), a common instrument used and carried by cable installation personnel.

Thus, there is a need for an improved leakage detection apparatus.

SUMMARY OF THE INVENTION

An advantage of the present invention is that a leakage detection apparatus includes a wireless antenna that is connected to a control instrument, allows a user to move away from the control instrument for leakage detection. The control instrument, which could be any type of electronic instrument such as personal digital assistants, professional equipment and the like, includes the control and display functions while the antenna includes the analysis functions.

A further advantage of the present invention is that the leakage detection apparatus has a dual configuration antenna usable in both deployed and retracted configurations, for precise and rough measurements, respectively.

Still another advantage of the present invention is that the leakage detection apparatus has an antenna that can produce an audio signal proportional to the level of the detected leaking signal.

Still a further advantage of the present invention is that the leakage detection apparatus is easily handled by users/technicians and compact for storage.

Yet another advantage of the present invention is that the leakage detection apparatus is a half-wavelength dipole antenna when in the deployed configuration and keeps a compensated sensitivity and directionality characteristics even in the mechanically protected retracted configuration.

Another advantage of the present invention is that the leakage detection apparatus includes a receiver with complex down conversion followed by an analog-to-digital conversion to feed a digital signal processor. The apparatus permits a wide band about a pre-determined signal frequency to be analyzed through conventional mathematical transformation technique such as Fast Fourier Transforms (FFT). The analysis method allows for an easy signal search and tracking, programmability, wideband noise detection, tagging detection without additional hardware.

According to a first aspect of the present invention, there is provided an antenna apparatus for detecting a leaked electromagnetic signal, the apparatus comprising: a telescoping antenna; a casing including a first casing portion and a second casing portion, a portion of the antenna being mounted in the first casing portion, the antenna being telescopically moveably relative to the first casing portion between a substantially extended configuration, in which the antenna extends away from the first casing portion, and a substantially retracted configuration, in which the antenna is substantially housed in the first casing portion; a signal analyzer disposed in the second casing portion, the signal analyzer being connected to the telescoping antenna, the electromagnetic signal being detected by the antenna and analyzed by the signal analyzer.

Typically, the telescoping antenna is a dipole antenna having two antenna poles, each pole having a first end and a second end, the first end of each pole being mounted end-to-end in the first casing portion.

Typically, the first casing portion includes a first hollow end portion, a second hollow end portion and a dividing wall, the first ends of each pole being mounted respectively in the first and second hollow end portions, the dividing wall separating the hollow end portions.

Typically, the first casing portion is generally tubular.

Typically, the two poles, when in the extended configuration, have a length, which is generally half that of a wavelength of the electromagnetic signal.

Typically, the first casing portion has a first axis and the second casing portion has a second axis, the first axis being orthogonal to the second axis, the first and second poles being aligned along the first axis.

Typically, the first casing portion is made from a material transparent to the electromagnetic signal.

Typically, the second casing portion includes a handle connected away from the antenna.

Typically, the second ends of each pole include graduated markings.

Typically, a sound level indicator is connected to the signal analyzer.

Typically, the leaked signal is from a communications network.

Typically, the communications network is a CATV network.

According to another aspect of the present invention, there is provided a leakage detector for detecting an electromagnetic signal leak in a communications network, the detector comprising: an antenna; a signal analyzer connected to the antenna, the electromagnetic signal being detected by the antenna and analyzed by the signal analyzer and converted to analyzed data; a control instrument in communication with the signal analyzer, the control instrument receiving an analyzed signal data from the signal analyzer.

According to another aspect of the present invention, there is provided a signal analysis method for analyzing an electromagnetic signal over a predetermined wide frequency band, the method comprising: digitally processing received electromagnetic signal data over a frequency band using mathematical transformation, the frequency band having a predetermined selectivity bandwidth increment into analyzed data, the predetermined selectivity bandwidth increment being smaller than the predetermined wide frequency band.

BRIEF DESCRIPTION OF THE DRAWINGS

Further aspects and advantages of the present invention will become better understood with reference to the description in association with the following Figures, in which.

DETAILED DESCRIPTION OF THE PREFERRED EMBODIMENTS

Figure 1:
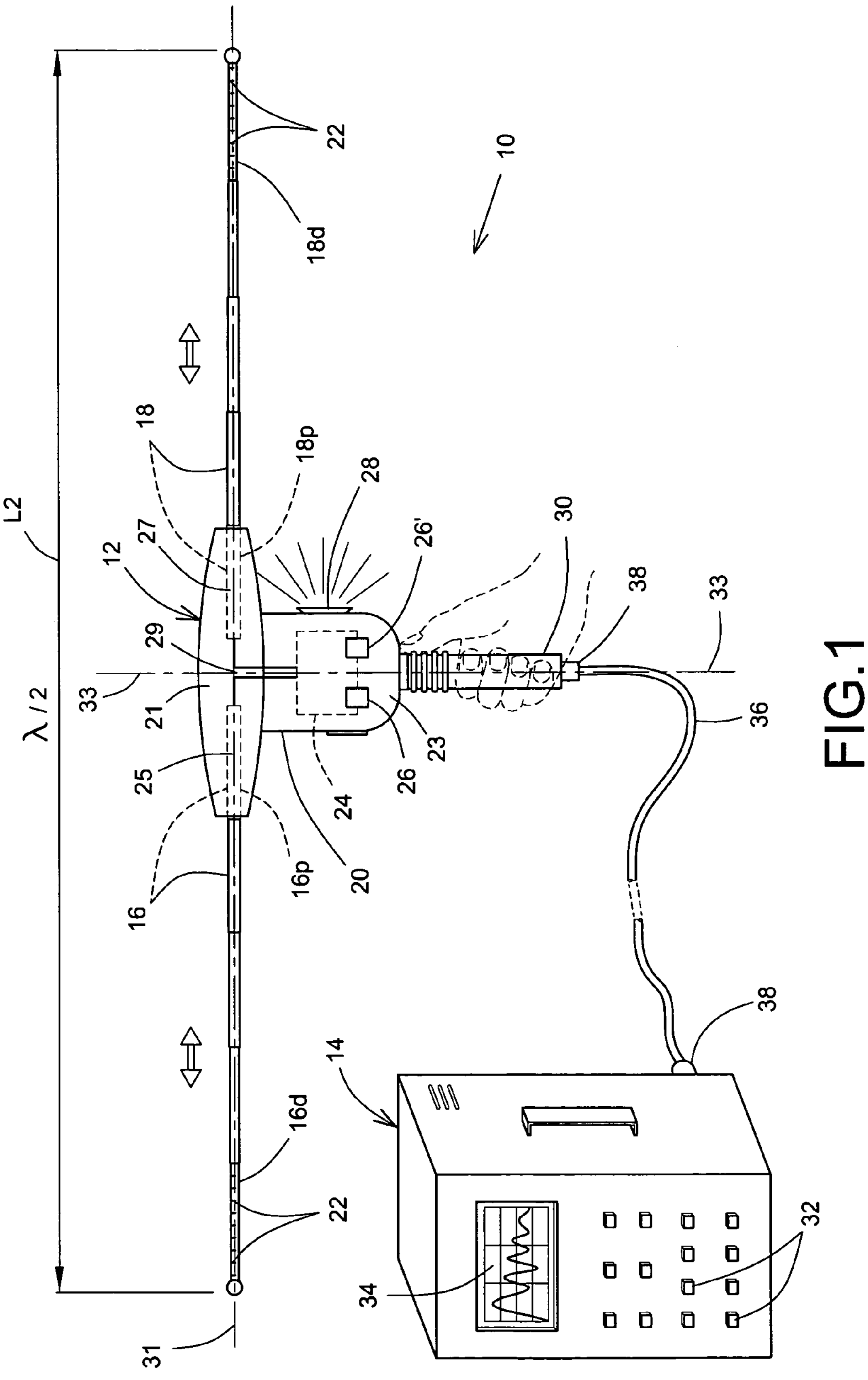
FIG. 1 is a schematic view of a leakage detection apparatus in accordance with an embodiment of the present invention, showing the antenna in a deployed configuration, the antenna includes modules to perform analysis functions and provide audio signals, and wire connects to an electronic instrument performing control and display functions.

Referring to FIG. 1, there is shown an antenna apparatus 10 for detecting a leaked electromagnetic signal from a communications network, specifically a CATV (Community Antenna Television) network. The apparatus 10 typically includes an antenna 12, a casing 20, a signal analyzer 24 and a control instrument 14.

Typically, the antenna 12, normally used for leakage detection measurements, is a half-wavelength dipole antenna. One skilled in the art will recognize that other types of antenna could be used such as a short monopole antenna and the like.

Figure 2:
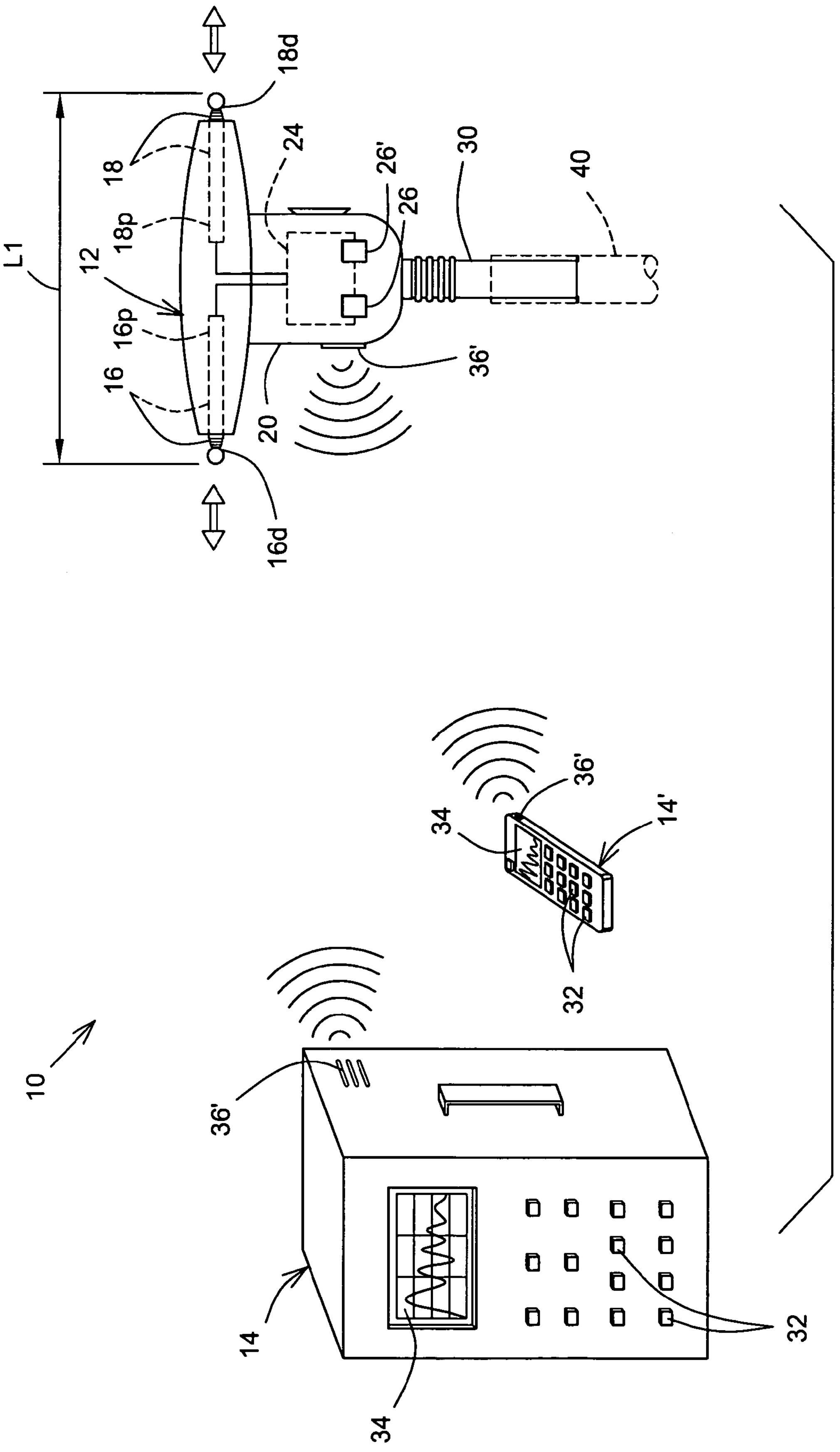
FIG. 2 is a view similar to FIG. 1, showing the antenna, with analysis function module, in a retracted configuration connected to a portable instrument for performing control and display functions through a wireless connection.

The dipole antenna 12 is selected because it is required by regulation for official leakage detection measurements due to its sensitivity and good directionality characteristics. The antenna 12 includes two generally elongated antenna poles 16, 18 mounted in the casing 20. The casing 20 includes a first casing portion 21 and a second casing portion 23. The first casing portion is typically, tubular and includes a first hollow end portion 25, a second hollow end portion 27 and a dividing wall 29 which separates the hollow end portions 25, 27. A first end **16*p*, 18*p* of each pole 16, 18 is mounted respectively in the first and second hollow end portions 25, 27 of the first casing portion 21 and are positioned in a generally end-to-end relationship relative to one another. Each pole 16, 18 is telescopically extendable relative to the first casing portion 21 between substantially extended configuration, in which the antenna poles 16, 18 extend away from the casing 20, and a substantially retracted configuration. As best illustrated in FIG. 2, the poles 16, 18 are substantially housed in the first casing portion 21 in the fully retracted configuration. Typically, the poles 16, 18** are a telescopic boom.

The casing 20 is typically made out of RF (Radio Frequency) transparent material, such as plastic and/or glass based materials and the like, which allows electromagnetic signals to pass therethrough and make the first ends **16*p*, 18*p* operative while being embedded. The second end 16*d*, 18*d* of each pole 16, 18 typically includes graduated markings 22 thereon to allow adjustment of its length depending on the wavelength $\lambda$ of the electromagnetic signal being detected, to allow more accurate measurements. A handle 30 is connected to the second casing portion 23 away from the antenna poles 16, 18** for ease of manipulation by the user.

The first casing portion 21 has a first axis 31 and the second casing portion has a second axis 33, which run generally orthogonal to each other. The first and second poles 16, 18 are aligned along the first axis 31.

Typically, when in the deployed, extended configuration, the dipole antenna 12 has a total length L2 (combined length of both poles 16, 18) of approximately half of the wavelength ($\lambda/2$) of the electromagnetic signal being detected, which is approximately forty (40) inches for the normal frequency band of about 130 MHz. Since this size of length L2 is generally cumbersome to use and fragile (frequently broken by handling), the antenna 12 allows its poles 16, 18 to retract in their retracted positions and still operate with a smaller combined length L1 (see FIG. 2), depending on the type of leakage detection measurement to be performed.

Furthermore, the casing 20 includes the signal analyzer, which analyzes the received electromagnetic signal. The signal analyzer is typically an analysis module 24, which is disposed in the second casing portion 23 and is electrically and differentially connected to the two poles 16, 18, which detect the electromagnetic signal analyze. The analysis module 24 is typically connected to at least an ON/OFF button 26 or the like for either activation or deactivation of the analysis module 24. Preferably, the analysis module 24 is connected to a sound level indicator 28, activated by its own ON/OFF button 26', that provides the user with a real time local rough audio signal corresponding to the signal detection level.

In operation, upon selection of the antenna configuration by the control instrument 14 (see details below), the analysis module 24 includes an antenna matching circuit (not shown) that is calibrated to properly adjust the gain and different calibration factors for the signal analysis. The result is the availability of the half-wavelength dipole whenever required (when in deployed configuration) but also of a mechanically protected dipole (when in retracted configuration), less sensitive but accurately compensated and still having the measurement directivity feature.

Typically, the dipole antenna 12 in the retracted configuration provides protection, better handling, and is used for rough level measurement made generally inside buildings or the like to detect location of leakage (if applicable) and ensure proper installation of electric wiring and outlet wall connectors for example.

The dipole antenna 12 in deployed configuration meets FCC regulation requirements and is generally used to perform outside electromagnetic signal leakage detection and obtain measurement values.

Typically, the control instrument 14 is in communication with the signal analyzer 24 and includes the control module (not shown) electronically coupled to a keypad 32 or the like for the user to provide inputs/parameters, a display module 34 to display leakage detection results and a data storage capability.

The control instrument 14, which could be any electronic device such as a SLM (Signal Level Meter), a conventional PDA 14' (Personal Digital Assistant) or the like with proper connectivity that can provide, with an appropriate program, for the control and display functions. AT2500 series specialized spectrum analyzers produced by Sunrise Telecom Incorporated® of San Jose, Calif. are can also be used as control instruments 14.

Although the antenna 12 can be electrically coupled to the control instrument 14 via a conventional wiring connection cable 36 typically connectable at both ends through standard type connectors 38 as shown in FIG. 1, the preferred connection is a wireless connection 36' such as but not limited to the BLUETOOTH™ interface as shown in FIG. 2.

Such an apparatus 10 with a self-contained antenna 12, but without user-interface and control, wirelessly connected to the control instrument 14 allows operation with any type of instrument 14 from a remote location.

In operation, the user inputs the different required parameters and control commands for the leakage detection with the antenna 12 to the control instrument 14 using the keypad 32 (or user-interface). The control instrument 14 then provides that information to the antenna 12 through an uplink communication via the wireless connection 36'. The user then holds the antenna 12 in the proper configuration to perform the signal leakage detection. The antenna 12 receives (collects or captures) the electromagnetic signal. The received signal is then analyzed by the analysis module 24. The analysis results are then sent to the control instrument 14 through a downlink communication via the wireless connection 36' to allow the control instrument 14 to display and/or store the leakage detection results.

The wireless link 36' between the control instrument 14 and the antenna 12 allows the user to easily move with the latter around the control instrument 14. The wireless link 36' is found to be further practical and safe when the antenna 12 is high up on an electrically insulating pole 40 (shown in dashed lines in FIG. 2) or the like to perform detection nearby a power line without having any metallic wire or pole that could act as an electrical conductor down to the grounded user.

Such a wireless connection 36' between the antenna 12 and the control instrument 14 could be practical in many situations. For example, the antenna 12, linked with a conventional GPS (Global Positioning System) for positioning, can be installed on a patrol vehicle or the like while the control instrument 14 or the like would be at the vehicle docking station to collect all the analyzed data (along with the corresponding location) obtained during the patrolling.

Although the current receiver design for leakage detection is based on analog circuits with the superheterodyne technology with a final IF (Intermediate Frequency) bandwidth in the range of three (3) to thirty (30) kHz to achieve the desired detection sensitivity, such narrow filters demand that tuning be stable and adjustable with high accuracy.

Typically, the analysis module 24 of the apparatus 10 uses a Zero-IF (Intermediate Frequency) receiver with a "complex" down-conversion of the received data into converted data followed by analog-to-digital (A/D) conversion. The digitized converted received data is then fed to a conventional Digital Signal Processor (DSP) of the analysis module 24. Through FFT (Fast Fourier Transforms) or the like mathematical process, a pre-selected wide frequency band of two hundred (200) kHz or the like is analyzed by the analysis module 24 with a predetermined selectivity bandwidth increment such as one (1) kHz, or any wider bandwidth, under software control. This wideband analysis allows for an easy search and tracking capabilities, easy custom programmability, wideband noise detection (such as electrical noise), as well as signal "tagging" detection (either amplitude or frequency modulation) without additional hardware.

Furthermore, the wideband analysis about any pre-determined frequency allows identification of any other nearby signals, in frequency, as well as the verification of the tagged signal looked for and the source of any detected noise, which is useful with overbuilt networks.

The signal analysis method for analyzing an electromagnetic signal over a predetermined wide frequency band comprises the following steps of:

digitally processing received electromagnetic signal data over a frequency band using mathematical transformation (such as FFT), the frequency band having a predetermined selectivity bandwidth increment into analyzed data, the predetermined selectivity bandwidth increment being smaller than the predetermined wide frequency band;

receiving the electromagnetic signal using a receiver; and performing a complex down-conversion of the received signal data into converted data.

While a specific embodiment has been described, those skilled in the art will recognize many alterations that could be made within the spirit of the invention, which is defined solely according to the following claims.

We claim:

1. An antenna apparatus for detecting a leaked electromagnetic signal, the apparatus comprising:

a telescoping antenna;

a casing including a first casing portion and a second casing portion, a portion of the antenna being mounted in the first casing portion, the antenna being telescopically moveably relative to the first casing portion between a substantially extended configuration, in which the antenna extends away from the first casing portion, and a substantially retracted configuration, in which the antenna is substantially housed in the first casing portion:

a signal analyzer disposed in the second casing portion, the signal analyzer being connected to the telescoping antenna, the electromagnetic signal being detected by the antenna and analyzed by the signal analyzer.

2. The apparatus, according to claim 1, in which the telescoping antenna is a dipole antenna having two antenna poles, each pole having a first end and a second end, the first end of each pole being mounted end-to-end in the first casing portion.

3. The antenna, according to claim 2, in which the first casing portion includes a first hollow end portion, a second hollow end portion and a dividing wall, the first ends of each pole being mounted respectively in the first and second hollow end portions, the dividing wall separating the hollow end portions.

4. The antenna, according to claim 3, in which the first casing portion is generally tubular.

5. The apparatus, according to claim 3, in which the two poles, when in the extended configuration, have a length, which is generally half that of a wavelength of the electromagnetic signal.

6. The apparatus, according to claim 3, in which the first casing portion has a first axis and the second casing portion has a second axis, the first axis being orthogonal to the second axis, the first and second poles being aligned along the first axis.

7. The apparatus, according to claim 6, in which the first casing portion is made from a material transparent to the electromagnetic signal.

8. The apparatus, according to claim 1, in which the second casing portion includes a handle connected away from the antenna.

9. The apparatus, according to claim 3, in which the second ends of each pole include graduated markings.

10. The apparatus, according to claim 1, in which a sound level indicator is connected to the signal analyzer.

11. The apparatus, according to claim 1, in which the leaked signal is from a communications network.

12. The apparatus, according to claim 11, in which the communications network is a CATV network.

13. A leakage detector for detecting an electromagnetic signal leak in a communications network, the detector comprising:

an antenna;

a signal analyzer connected to the antenna, the electromagnetic signal being detected by the antenna and analyzed by the signal analyzer and converted to analyzed data;

a control instrument in communication with the signal analyzer, the control instrument receiving an analyzed signal data from the signal analyzer, the control instrument is wirelessly connected to the antenna for receiving an analysis control command therefrom and transmitting the analyzed data thereto.

14. The detector, according to claim 13, in which the control instrument is electrically connected to the antenna.

15. The detector, according to claim 13, in which the control instrument is a PDA or an SLM.

16. The detector, according to claim 13, in which the antenna is mounted in a casing, the casing including a first casing portion and a second casing portion, a portion of the antenna being mounted in the first casing portion, the antenna being telescopically moveably relative to the first casing portion between a substantially extended configuration, in which the antenna extends away from the first casing portion, and a substantially retracted configuration, in which the antenna is substantially housed in the first casing portion.

17. The detector, according to claim 16, in which the antenna is a dipole antenna having two antenna poles, each pole having a first end and a second end, the first end of each pole being mounted end-to-end in the first casing portion.

18. A signal analysis method for analyzing an electromagnetic signal over a predetermined wide frequency band, the method comprising:

digitally processing received electromagnetic signal data over a frequency band using mathematical transformation, the frequency band having a predetermined selectivity bandwidth increment into analyzed data, the predetermined selectivity bandwidth increment being smaller than the predetermined wide frequency band.

19. The method, according to claim 18, further includes: receiving the electromagnetic signal using a receiver.

20. The method, according to claim 18, further includes:

performing a complex down-conversion of the received signal data into converted data.

* * * * *